(12) United States Patent
Ho et al.

(10) Patent No.: US 6,573,579 B1
(45) Date of Patent: Jun. 3, 2003

(54) PROJECTOR EMPLOYING OEL IMAGE PANELS

(75) Inventors: Kuan-Jui Ho, Tainan (TW); Peng-Yu Chen, Taichung Hsien (TW); Shuang-Chao Chung, Chung-Li (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 0 days.

(21) Appl. No.: 10/051,130

(22) Filed: Jan. 22, 2002

(51) Int. Cl.[7] .......................... H01L 27/14; H01L 31/00
(52) U.S. Cl. .......................... 257/431; 438/48; 438/54; 438/69
(58) Field of Search ........................................ 257/431

(56) References Cited

U.S. PATENT DOCUMENTS

| | | | | |
|---|---|---|---|---|
| 4,875,064 A | * | 10/1989 | Umeda et al. | 353/78 |
| 5,573,324 A | * | 11/1996 | De Vaan | 353/77 |
| 5,674,635 A | * | 10/1997 | Hsieh et al. | 428/690 |
| 5,879,067 A | * | 3/1999 | De Vaan | 353/98 |
| 5,929,561 A | * | 7/1999 | Kawami et al. | 313/506 |

\* cited by examiner

Primary Examiner—David Nelms
Assistant Examiner—Andy Huynh
(74) Attorney, Agent, or Firm—Rosenberg, Klein & Lee

(57) ABSTRACT

A projector employing multiple organic electroluminescence (OEL) image panels, in which each image panel is made with multiple light-emitting OEL components. Each light-emitting OEL component represents one image element. The OEL component is capable of emitting individual prime colors, red (R), green (G) or blue (B), or producing white light which is then made to passes through color filters to produce RGB colors. The new structure for the projector provides the features of downsized dimensions, luminous efficiency and light-focusing capability.

19 Claims, 4 Drawing Sheets

PROJECTOR EMPLOYING OEL IMAGE PANELS

BACKGROUND OF THE INVENTION

1. Field of the Invention

The present invention relates to a projector employing multiple organic electroluminescence (OEL) image panels, in which each image pixel is represented by a light-emitting OEL component. The new structure for the projector provides the features of downsized dimensions, luminous efficiency and image focusing capability.

2. Description of Related Art

The structure of a conventional light projection device includes a light source for white light, a light splitter, three separate image panels of red (R), green (G) and blue (B) prime colors and a light-mixing apparatus. The basic operating technique of the device includes the following steps.

(1) White light as a light ray is output by the light source.

(2) the light ray is then processed by a light splitter (i.e. Dichroic mirror) and filtered to derive red (R), green (G) and blue (B) colors separately.

(3) The light rays of prime color are then reflected evenly onto three corresponding image panels.

(4) Then the intensity of the prime color ray passing through or being reflected on each point of the image panel is controlled by brightness for the corresponding image element.

(5) Prime color images in gray scale are output from the individual image panels.

(6) These three images of prime color in gray scale are refocused on a light mixing apparatus by image superposition to produce a full color image.

However, the structure of the conventional projector described still has the following drawbacks.

(1) For continuous light modulation by a transmission type and reflection type of image panel, the light ray output from the light source needs to pass through the light splitter to sort out the prime colors before reaching the image panel. Since the light source and light modulation apparatus are independent units, light rays of prime color have to be fed uninterruptedly and uniformly to the corresponding image panels. If the image to be displayed contains large segments of black or dark colors, the light source still has to output white light and then let the three image panels block off most of the light to form black or dark images. Such method suggests considerable waste of luminous resources.

(2) To attain even luminescence on the output image, white light passing through the light splitter to produce the three prime colors has to be sufficiently strong and exceptionally uniform, and other optical apparatus is also needed for the light modulation. No matter what kind of optical apparatus is used, it is difficult to attain perfect uniformity in light modulation, not to mention other problems such as additional light modulation, losing more light energy and lower luminous efficiency.

(3) With an increased number of components in a projector, light passing through the system is likely to attenuate. When the luminous efficiency goes down, the unused light energy will be converted to thermal energy. If the projector generates large amounts of heat, it will considerably reduce the operating life of the internal components, thereby causing heat dissipation problems. It will also have negative impact on the efforts to further reduce the size of the projector design.

SUMMARY OF THE INVENTION

The main objective of the present invention is to provide a projector using an OEL image panel. The OEL image panel with light-emitting capability can replace the light source and light splitter in conventional projectors, such that the size and complexity of the projector can be reduced.

Another objective of the present invention is to provide a projector using an OEL image panel, wherein the intensity of light emission can be controlled through the voltage driving the OEL component. Under such condition, luminescence of the image can be appropriately adjusted to prevent any waste of resource resulting from unwanted light.

The image panel having OEL components forms the main part of the projector proposed in the present invention, and the projector comprises one or more image panels, a light correction means and an imaging apparatus. Each image panel is formed with multiple OEL components. The light correction means corrects the projection angle of image signals from individual image panels while reducing light attenuation. The imaging apparatus composes prime color image signal in gray scale output from individual image panels to produce a full color image.

The features of and methods used in the present invention will be more clearly understood after a careful reading of the detailed description with appropriate reference to the accompanying drawings.

DETAILED DESCRIPTION OF THE PREFERRED EMBODIMENT

Figure 1:
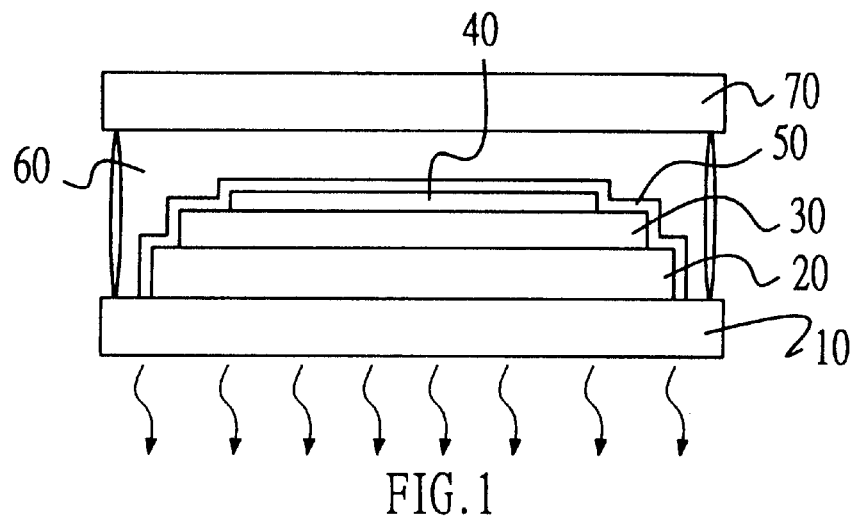
FIG. 1 is a side plan view of an OEL component used in a projector employing multiple organic electroluminescence (OEL) image panels in accordance with the present invention.

With reference to FIG. 1, an OEL component assembly comprises a transparent base plate (10), a transparent indium tin oxide (ITO) anode (20), a light-emitting OEL layer (30), a metal cathode (40), a passivation layer (50), resin filling (60) and a covering strip (70). The transparent indium tin oxide (ITO) anode (20) is formed on the base plate (10). The light-emitting OEL layer (30) is formed on the ITO anode (20). The metal cathode (40) is formed on the light emitting layer (30). The passivation layer (50) is applied over the foregoing stacked component assembly. The resin filling (60) fills the cavity of the stacked component assembly. The covering strip (70) is applied on top of all the foregoing elements. The foregoing sequence also represents the steps necessary for completing the packaging of the OEL component.

When voltage is applied across the metal cathode layer (40) and the transparent ITO anode layer (20), electrons and holes from the cathode and anode respectively migrate to the light-emitting OEL layer (30), where the electrons and holes recombine and produce excitons releasing energy in the form of light. The color of light produced in this excitation process will depend on the materials of the light-emitting OEL layer (30). A light ray is emitted from the transparent ITO anode (20) through the transparent base plate.

The material to make the base plate (10) can be glass, plastic or metal. The plastic base plate can be polyester, polycarbonates, polyacrylates, polystyrene, polyethyleneterephthalate or other materials derived from these materials.

The materials to make the light-emitting OEL layer can be separated into two kinds. The first one is pigment and dye for making molecule-based light emitting devices, and another one is a conjugated polymer for making polymer-based light emitting devices. OEL has the basic characteristics of a light emitting diode (LED) as an light emitter. The molecule-based OEL component for constructing the light-emitting OEL layer (30) is called OLED, and the OEL component with the polymer structure is called PLED. The method of manufacturing the light-emitting OEL layer (30) is different for OLED and PLED as a result of the basic materials used. An organic film of OLED is manufactured with a vacuum thermal evaporation process, whereas a film of PLED is formed by spin-coating, or ink jet printing or screen-printing can also be the other alternatives.

The metal cathode (40) is composed of Ca, Ag, Mg, Al, Li or other metallic materials with low operating conditions or compounds of those materials. The formation process can be vacuum thermal evaporation or sputtering.

The passivation layer (50) as a protective layer is composed of insulating oxide, carbide, nitride or other mixed dielectric materials, such as SiNx, SiOx, SiONx, AlNx and AlCx.

The foregoing OEL components together form the OEL image panel for the projector in accordance with the present invention, which possesses light-emitting characteristics and is capable of emitting different colors based on the material of light-emitting OEL layer. The OEL image panel employing OEL components therefore can replace the light source and light splitter used in conventional projectors.

Figure 2:
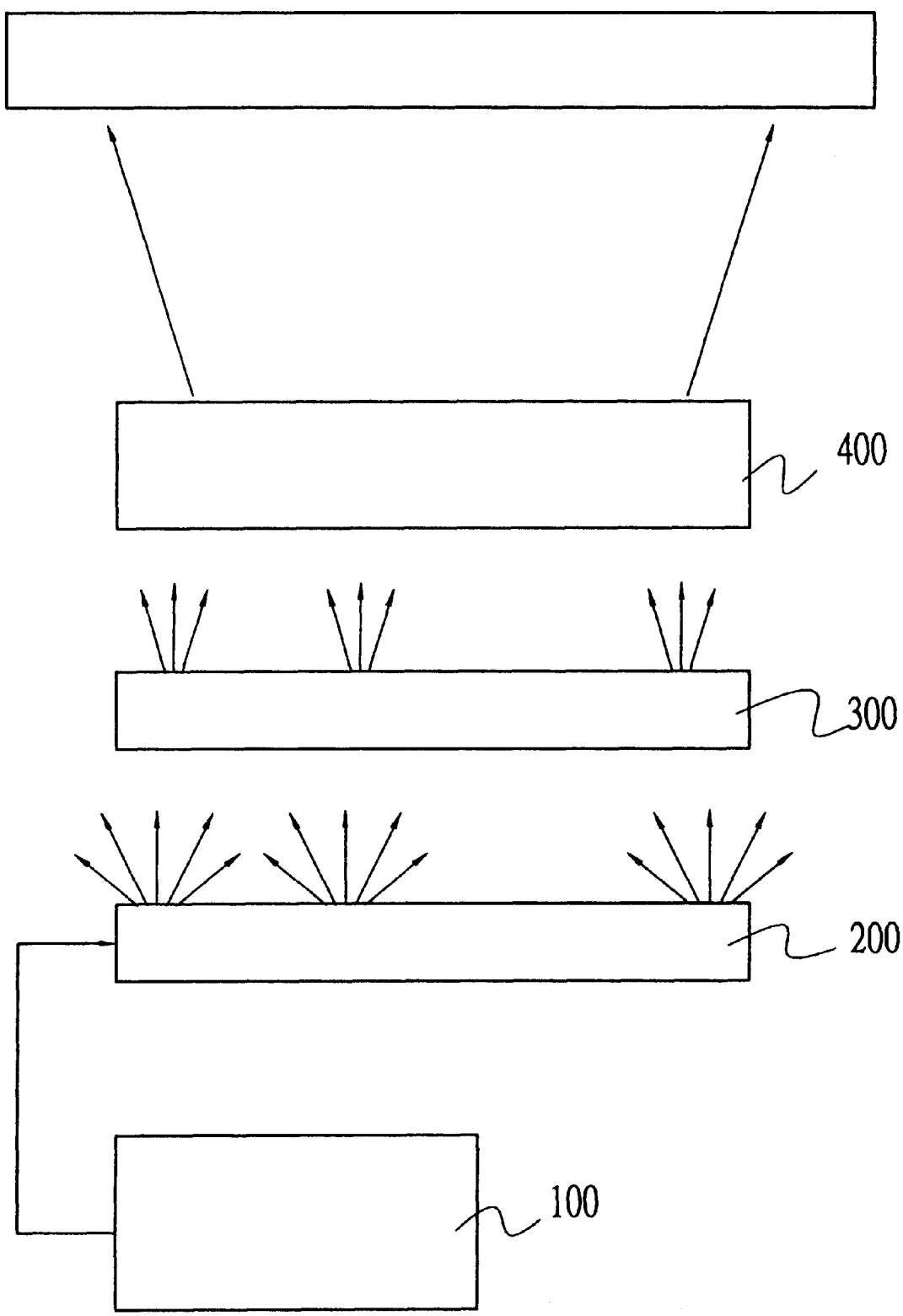
FIG. 2 is a functional block diagram of the projector employing multiple organic electroluminescence (OEL) image panels in accordance with the present invention.

With reference to FIG. 2, the projector in accordance with the present invention comprises an OLED driving circuit (100), an image panel using OEL components (200) (only one type of image panel is described in this embodiment for simple illustration), a light correction means (300) and an imaging apparatus (400). The image panel (200) is assembled with multiple OEL components, each being represented by an image element (pixel).

The OLED driving circuit (100) controls the light emission of each OEL component packed into the OEL image panel (200), and the intensity of light emission will depend on the brightness for each image element. For the imaging apparatus (400) to capture most of the light signals output from OEL image panel (200), a light correction means (300) must be created between the OLED image panel (200) and the imaging apparatus (400). Light output from OEL image panel (200) is corrected by the light correction means (300) to converge on the imaging apparatus (400). The image output to the imaging apparatus (400) can be considerably improved by the light correction means (300).

Figure 3:
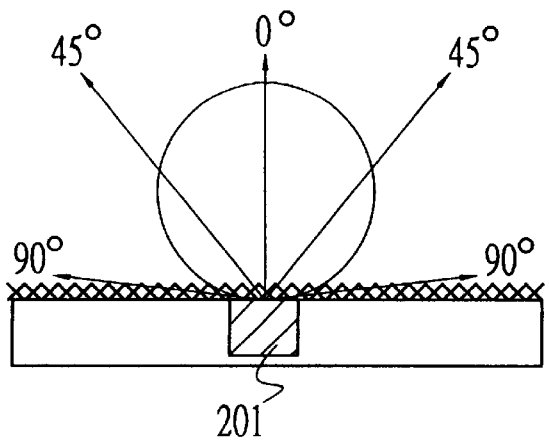
FIG. 3 is a light scattering diagram of an OEL component on the image panel in FIG. 2.

With reference to FIGS. 2 and 3, the actual light scattered from an OEL component (201) on the OEL image panel (200) is uniformly scattered on a semi-spherical block. This kind of scattered light without correction is not suitable for perpendicular projection and light convergence. Only a small amount of the light ray can be captured by the imaging apparatus (400).

Figure 4:
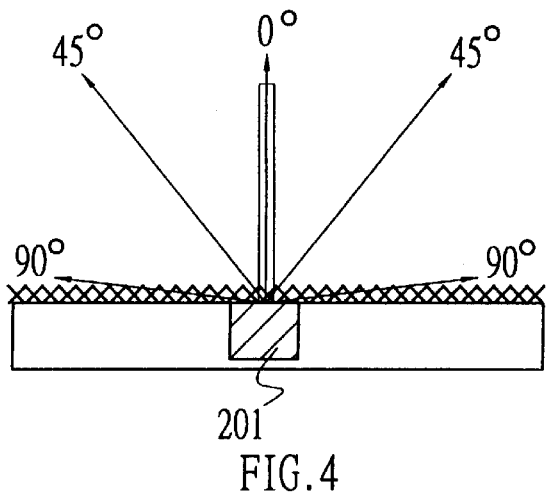
FIG. 4 is an ideal light scattering diagram of an OEL component on the image panel in FIG. 2.

If the light ray could be corrected for projection perpendicular to the light emission point without light diffusion as shown in FIG. 4, the imaging apparatus (400) would be able to capture most of the image signals and consequently be able to attain the highest level of luminous efficiency.

Figure 5:
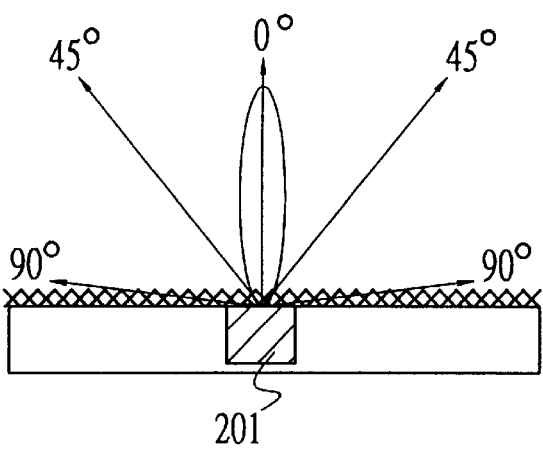
FIG. 5 is a corrected light scattering diagram of an OEL component on the image panel in FIG. 2.

If the light ray output from the OEL image panel (200) passes through the light correction means (300) as shown in FIG. 5, more light will converge on the imaging apparatus (400). Even though some of the light may still be lost, the image produced through this means will be brighter than the uncorrected case shown in FIG. 3.

The light correction means (300) can be implemented using different methods including a microlens, changing the curvature of the transparent base plate (10) of each OEL component, using a microcavity or a combination of the foregoing.

Figure 6:
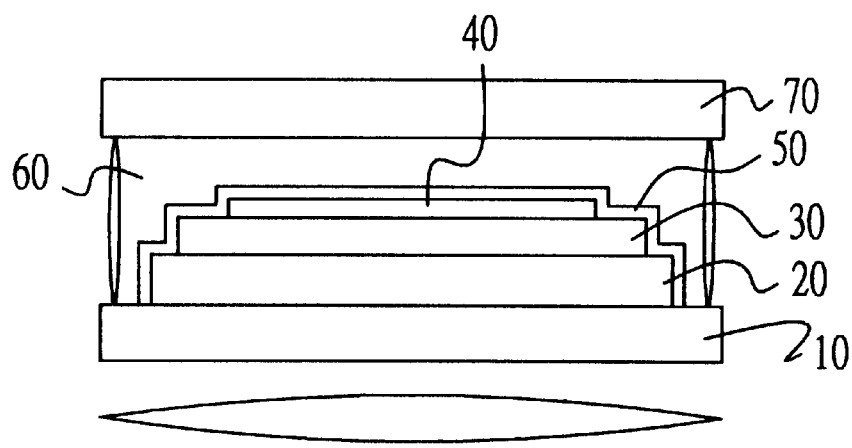
FIG. 6 is a side plan view of the first embodiment of the light correction means.

(1) With reference to FIG. 6, a microlens matrix is mounted on the OEL image panel (200). Either, a microlens is mounted on each image element of the OEL image panel (200), or multiple image elements can be made to share a microlens. Light passing through a group of microlenses forming a microlens matrix will converge. Under such condition, the light rays from various OEL components will fall within the angle of reception of the imaging apparatus (400).

Figure 7:
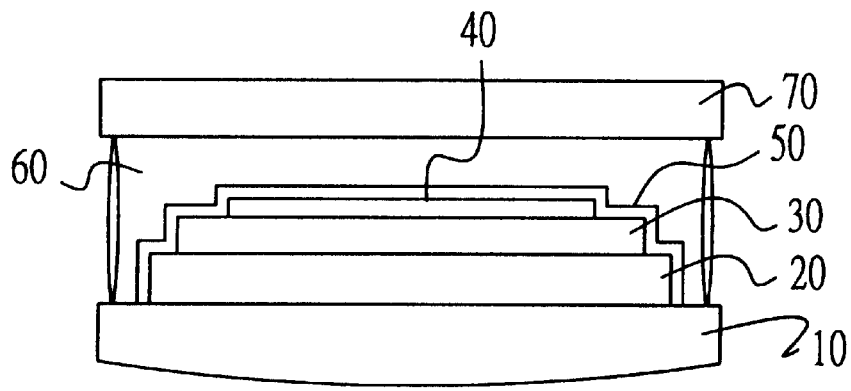
FIG. 7 is side plan view of the second embodiment of the light correction means.
Figure 8:
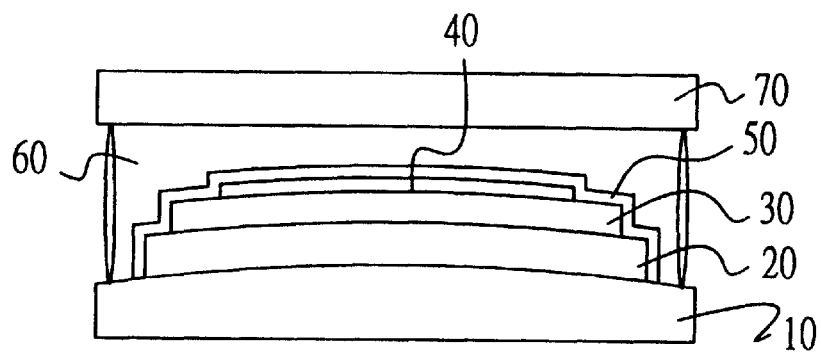
FIG. 8 is a side plan view of the third embodiment of the light correction means.

(2) With reference to FIGS. 7 and 8, the transparent base plate (10) of each OEL component is designed with a specific curvature, such that light output from the transparent base plate (10) will converge on the imaging apparatus (400).

Figure 9:
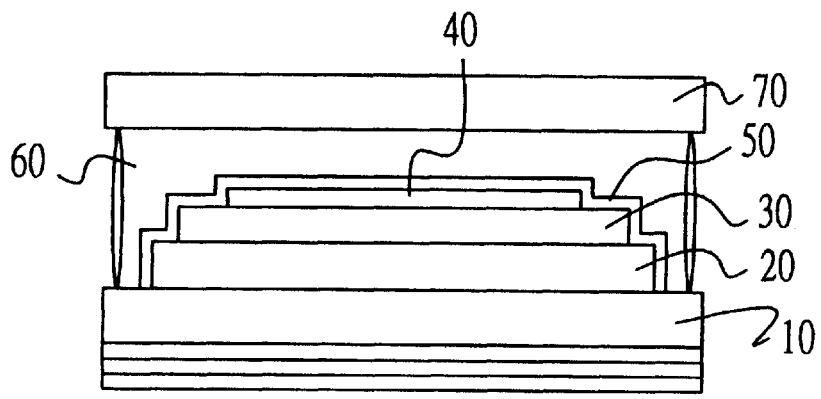
FIG. 9 is a side plan view of the fourth embodiment of the light correction means.

(3) With reference to FIG. 9, a multi-layer thin film is coated over the transparent base plate (10) of each OEL component forming the OEL image panel (200), such that light passing through will cause resonance between the layers of film, thus filtering out unwanted wavelengths. The filtering effect will be different for different angles of incidence and reflection. Only the range of light with narrow wavelength can pass through in a perpendicular direction. Thus, the introduction of a microcavity utilizing these light characteristics can cause an OEL component to produce the largest amount of light in a particular angle for good reception by the projector.

Figure 10:
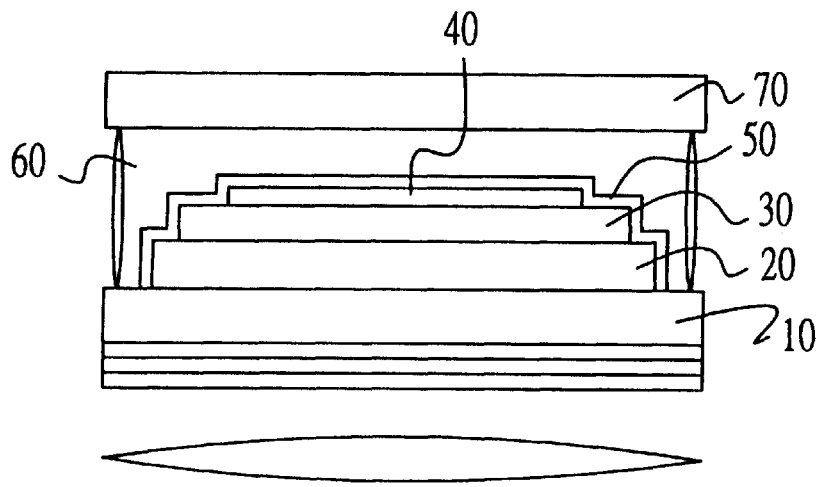
FIG. 10 is a side plan view of the fifth embodiment of the light correction means.

With reference to FIG. 10, the foregoing three light correction means (300) can be used in combination to double the correction effect. Accordingly, the light rays from OEL components can be adjusted to produce an even better convergence effect on the imaging apparatus (400). In another embodiment of the present invention, a single image panel (200) can be used to produce a full color image, wherein the single image panel (200) having multiple OEL components mounted thereon. A pixel of an image can form by mixing three prime colors emitted from three OEL components, whereby the pixel of the image can present in full color. Since the full color image can produce with a single image panel without the color mixing by the image apparatus (400), the image apparatus (400) is not necessary to be included in the projector.

The foregoing illustration of the preferred embodiments of the present invention are intended to be illustrative only, under no circumstances should the scope of the present invention be so restricted. The present invention possesses the apparent advantages aforementioned as compared with the conventional method.

What is claimed is:

1. A projector employing organic electroluminescence (OEL) image panels, the projector comprising:
   at least one image panel, wherein multiple OEL components are mounted on the at least one image panel to emit RGB prime colors to form a full color image, and the multiple OEL components represent multiple image pixels of the full color image;

three image panels in three separate colors red, green and blue, wherein multiple OEL components are mounted on each image panel to emit light rays in one of the three RGB prime colors, and each one of the OEL components represents an image element on the image panel;

a driving circuit to control the light intensity from the multiple OEL components mounted on the at least one image panel;

an imaging apparatus to compose the individual image signals output from the three image panels to produce a full color image; and a light correction means to correct the light projection angle from the at least one image panel, set up front of the at least one image panel to bring the color image into focus.

2. The projector employing OEL image panels as claimed in claim 1, wherein the at least one image panel is made up of three image panels in three separate colors red, green and blue, wherein the multiple OEL components are mounted on each image panel to emit light rays in one of the three RGB prime colors, and each one of the OEL components represents an image pixel, and wherein the imaging apparatus to compose individual image signals output from the three image panels to produce the full color image, and the light correction means is used to correct the light projection angle from each image panel, set up between the three image panels and the imaging apparatus to bring the full color image into focus.

3. The projector employing OEL image panels as claimed in claim 2, wherein each OEL component includes: a transparent base plate, an anode layer formed on the base plate, a light-emitting OEL layer formed on the anode and a cathode layer formed on the light-emitting OEL layer, such that when a voltage is applied across the cathode layer and anode layer, light is emitted through the transparent base plate.

4. The projector employing OEL image panels as claimed in claim 3, wherein a passivation layer is coated on the stack structure composed of the base plate, the anode layer, the light-emitting OEL layer and the cathode layer.

5. The projector employing OEL image panels as claimed in claim 4, wherein a covering strip and resin filling package the OEL component assembly.

6. The projector employing OEL image panels as claimed in claim 5, wherein the base plate of the OEL component can be made of polyester, polycarbonates, polyacrylates, polyacystyrene or polyethyleneterephthalate.

7. The projector employing OEL image panels as claimed in claim 6, wherein the anode layer of the OEL thin film is made of indium tin oxide (ITO).

8. The projector employing OEL image panels as claimed in claim 7, wherein the cathode layer of the OEL component can be made of Ca, Ag, Mg, Al, Li or other metal materials with low operating conditions, or compounds from those metals.

9. The projector employing OEL image panels as claimed in claim 8, wherein a molecule-based light emitting layer of the OEL thin film is formed by vacuum thermal evaporation.

10. The projector employing OEL image panels as claimed in claim 8, wherein the polymer-based OEL thin film of OEL component is formed by spin-coating, ink jet printing or screen printing.

11. The projector employing OEL image panels as claimed in claim 3, wherein the light correction means has a microlens mounted on each OEL component, together forming a microlens matrix on each image panel, such that the light ray output from each image panel can be made to converge on the imaging apparatus within the angle of reception.

12. The projector employing OEL image panels as claimed in claim 9, wherein the light correction means has a microlens mounted on each OEL component, together forming a microlens matrix on each image panel, such that the light ray output from each image panel can be made to converge on the imaging apparatus within the angle of reception.

13. The projector employing OEL image panels as claimed in claim 10, wherein the light correction means is to have a microlens mounted on each OEL component, together forming a microlens matrix on each image panel, such that the light ray output from each image panel can be made to converge on the imaging apparatus within the angle of reception.

14. The projector employing OEL image panels as claimed in claim 3, wherein the light correcting means is to design a specific curvature on the transparent base plate of each OEL component, such that light output from the transparent base plate will converge on the imaging apparatus.

15. The projector employing OEL image panels as claimed in claim 9, wherein the light correcting means is to design a specific curvature on the transparent base plate of each OEL component, such that light output from the transparent base plate will converge on the imaging apparatus.

16. The projector employing OEL image panels as claimed in claim 10, wherein the light correcting means is to design a specific curvature on the transparent base plate of each OEL component, such that light output from the transparent base plate will converge on the imaging apparatus.

17. The projector employing OEL image panels as claimed in claim 3, wherein the light correction means covers the transparent base plate of each OEL component with multi-layer thin film, such that light passing through will cause resonance, enabling light convergence through the transparent base plate.

18. The projector employing OEL image panels as claimed in claim 9, wherein the light correction means covers the transparent base plate of each OEL component with multi-layer thin film, such that light ray passing through will cause resonance, enabling light convergence through the transparent base plate.

19. The projector employing OEL image panels as claimed in claim 10, wherein the light correction means covers the transparent base plate of each OEL component with multi-layer thin film, such that light ray passing through will cause resonance, enabling light convergence through the transparent base plate.

* * * * *